(12) United States Patent
Williams

(10) Patent No.: US 6,411,150 B1
(45) Date of Patent: Jun. 25, 2002

(54) DYNAMIC CONTROL OF INPUT BUFFER THRESHOLDS

(75) Inventor: Timothy J. Williams, Bellevue, WA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/772,716

(22) Filed: Jan. 30, 2001

(51) Int. Cl.[7] ............................ H03H 11/26; H03K 5/12
(52) U.S. Cl. ...................... 327/281; 327/276; 327/170; 327/112
(58) Field of Search ................... 327/270, 276, 327/281, 170, 205, 206, 68, 74, 108, 112

(56) References Cited

U.S. PATENT DOCUMENTS

| | | | | |
|---|---|---|---|---|
| 5,506,534 A | * | 4/1996 | Guo et al. .................. | 327/281 |
| 5,684,423 A | * | 11/1997 | Koyashiki et al. .......... | 327/270 |
| 5,949,268 A | * | 9/1999 | Miura et al. ................. | 327/281 |
| 5,949,292 A | * | 9/1999 | Fahrenbruch et al. ....... | 327/281 |
| 6,014,050 A | * | 1/2000 | McClure ..................... | 327/281 |

OTHER PUBLICATIONS

David G. Wright, "Method and Apparatus for Accurately Reading a Potentiometer", U.S. Ser. No. 09/821,680, filed Mar. 29, 2001.

* cited by examiner

*Primary Examiner*—Toan Tran
(74) *Attorney, Agent, or Firm*—Christopher P. Maiorana, P.C.

(57) ABSTRACT

A method for dynamically selecting an input threshold on an input pin comprising the steps of (A) generating one or more control signals from a user selectable register and (B) selecting the input threshold from a plurality of thresholds in response to at least one of the control signals.

20 Claims, 4 Drawing Sheets

DYNAMIC CONTROL OF INPUT BUFFER THRESHOLDS

FIELD OF THE INVENTION

The present invention relates to a method and/or architecture for implementing input buffers generally and, more particularly, to a method and/or architecture for dynamically controlling the threshold voltage of an input buffer.

BACKGROUND OF THE INVENTION

It is often desirable for microcontrollers, particularly those used in low-cost applications, to maximize the utility of the I/O pins. Many embedded controller applications are enhanced by having more I/O pins, or by providing more versatility within a given I/O pin. For inputs, a user typically has only a fixed threshold voltage (i.e., TTL or CMOS levels). An A/D converter function can increase the voltage-measuring capability of a pin. However, such additional functionality may add prohibitive cost to the device. Additionally, lack of flexibility and limited voltage measuring capability at a particular pin may also be disadvantageous. Multiple pins and buffers can be implemented to provide different thresholds. However, such an approach increases the overall pin count and cost of the device in which the pins are implemented.

Referring to FIG. 1, an example of a conventional input buffer 10, such as for a CMOS process, is shown. The buffer 10 has a threshold voltage that depends on the transistor characteristics and the relative sizing of the pull-up PMOS device 12 compared with the pull-down NMOS device 14. The buffer 10 is limited to a single threshold at a given voltage and temperature.

It would be desirable to implement an input buffer with a dynamically configurable threshold.

SUMMARY OF THE INVENTION

The present invention concerns a method for dynamically selecting an input threshold on an input pin comprising the steps of (A) generating one or more control signals from a user selectable register and (B) selecting the input threshold from a plurality of thresholds in response to at least one of the control signals.

The objects, features and advantages of the present invention include providing a method and/or architecture for dynamically controlling the threshold voltage of an input buffer that may (i) be implemented using a specific technology, such as CMOS or other technologies and logic families, (ii) be implemented without consuming additional power (when compared to a typical CMOS input buffer), and/or (iii) implement dynamically selectable thresholds on input buffers.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 2:
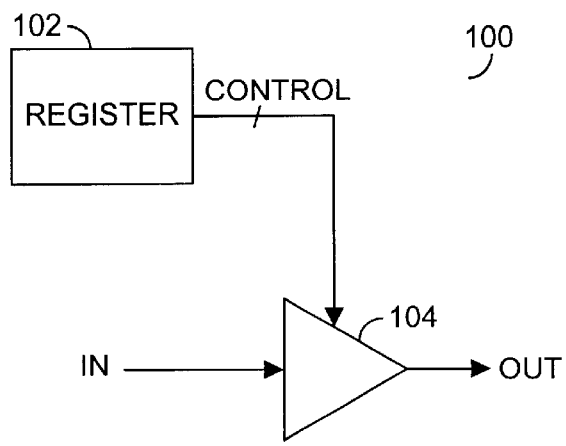
FIG. 2 is a block diagram of a preferred embodiment of the present invention.

Referring to FIG. 2, a block diagram of a circuit 100 is shown in accordance with a preferred embodiment of the present invention. The circuit (or system) 100 generally comprises a register block (or circuit) 102 and a buffer block (or circuit) 104. The register circuit 102 may present a signal (e.g., CONTROL) to the buffer 104. The signal CONTROL may be a single or multi-bit signal. The register 102 may be loadable by a user. The buffer 104 may receive a signal (e.g., IN) and present a signal (e.g., OUT). The buffer 104 may be implemented, in one example, as an input buffer.

The system 100 may allow the register circuit 102 to provide dynamic control of the threshold voltage of the buffer 104. In particular, the circuit 100 may provide an architecture, circuit and/or method for dynamically controlling the threshold voltage of the buffer 104.

The threshold of the buffer 104 may be user-selectable at any time in response to the signal CONTROL presented by the register 102. Two (or more) logic levels (e.g., CMOS, TTL, etc.) may be implemented for the buffer 104. The circuit 100 may (i) be implemented with very low-cost components (when compared with conventional approaches that implement separate pins and buffers for different thresholds), (ii) simplify interfacing to external components, (iii) enable a low-cost A/D method for implementing low cost input devices (e.g., joysticks, etc.) and/or (iv) provide control of input buffer threshold voltage. While the circuit 100 may offer two or more input threshold voltages, the particular number of threshold voltages may be extended to any desired/practical number to meet the design criteria of a particular implementation.

The circuit 100 may allow a user to dynamically switch between two or more threshold voltages for a given I/O pin. The circuit 100 has a number of advantages when compared with conventional input buffers. First, a given pin on a chip may be chosen to interface to external circuitry with a threshold that may provide greater flexibility and/or accuracy than working with a single, fixed threshold pin or buffer. Second, since the threshold voltage can be changed dynamically between two or more voltages, the input buffer 104 may provide, in some applications, a reasonably accurate measuring system that is not possible with classic single-input threshold buffers. An example of such a system may occur when the resistance of an input device, such as a joystick, is measured. In such a case, a very low-cost A/D conversion function is achieved with only a single external capacitor in addition to the joystick potentiometer and a dynamically controlled input buffer (e.g., with two threshold states).

The circuit 100 may be implemented with a minimum of cost. For example, the circuit 100 may be implemented along with a typical microcontroller or application specific integrated circuit (ASIC) device. The register 102 generally holds the selected threshold state(s) and configures the input buffer 104 to the desired threshold voltage.

Figure 3:
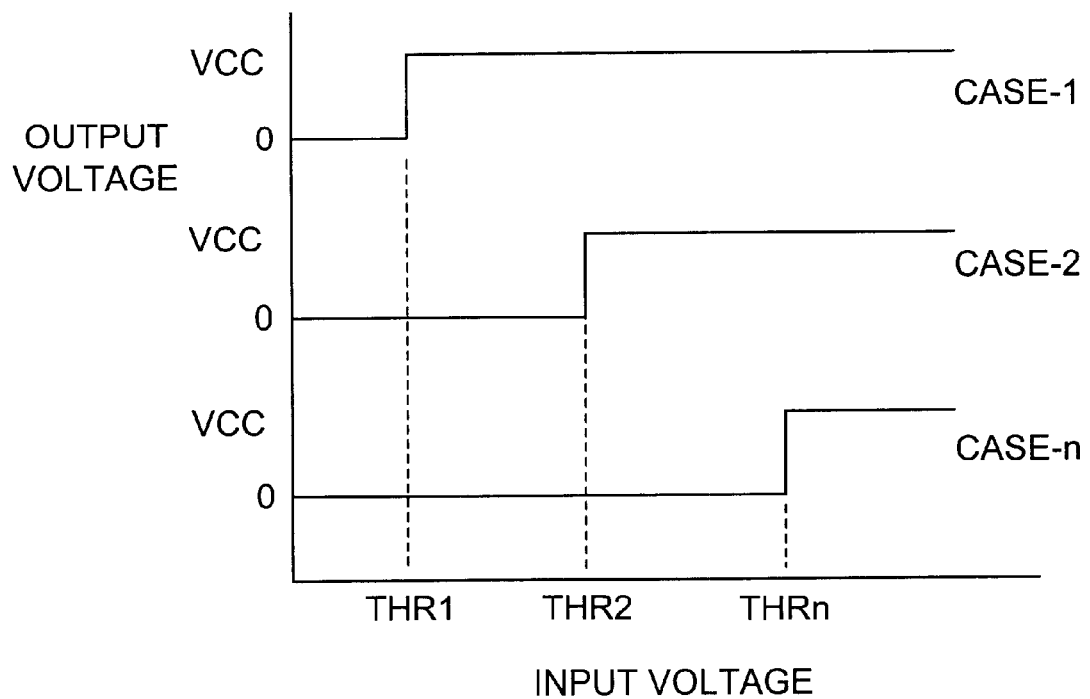
FIG. 3 is a diagram illustrating output waveforms of the present invention.

Referring to FIG. 3, a diagram illustrating the distinct thresholds at an input is shown. The input buffer 104 switches from a digital "low" to a digital "high" at the selected input threshold voltages (e.g., THR1, THR2, THRn). The threshold THR1 is illustrated having a lower voltage threshold than the thresholds THR2 and THRn. Since a particular pin (via the input buffer 104) may be configured to operate at any of the thresholds THR1–THRn, greater flexibility may be achieved.

Figure 4A:
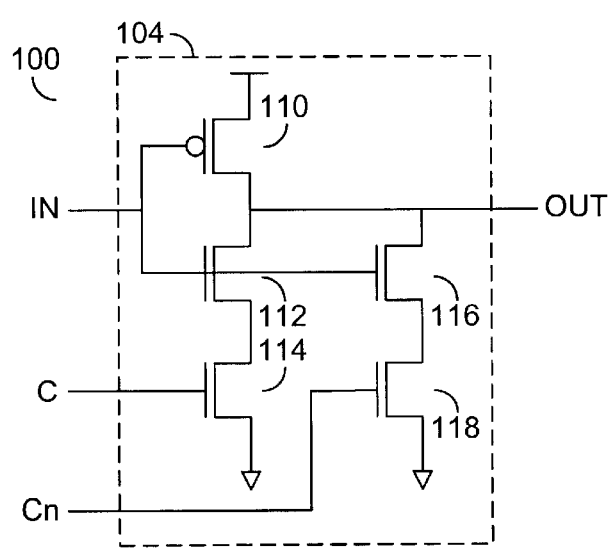
FIGS. 4(a–b) are schematics of the preferred embodiment of the present invention.

Referring to FIG. 4a, an example schematic of the present invention is shown implemented as a typical input buffer. A more detailed diagram of the circuit 104 is shown comprising a transistor 110, a transistor 112, a transistor 114, a transistor 116 and a transistor 118. The transistor 110 may be implemented as a PMOS transistor. The transistors 112, 114, 116 and 118 may be implemented as NMOS transistors. However, the particular type and polarity of the transistors 110–118 may be varied accordingly to meet the design criteria of a particular implementation.

Figure 1:
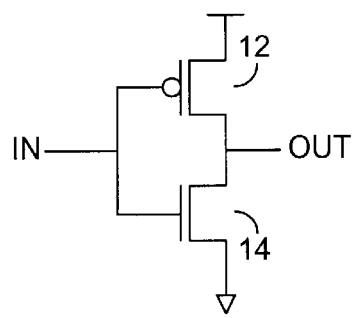
FIG. 1 is a diagram of a conventional buffer.

The PMOS device 110 and the NMOS device 112 may receive the input IN. The NMOS device 116 may also be connected to the input IN. The device 112 is connected in series with the NMOS device 114, which is used for selecting the desired threshold. Similarly, the device 118 is generally connected in series with the device 116, which may also be used for selecting the desired threshold. The devices 114 and 118 receive control signals C–Cn to select the desired threshold. The threshold of the inverter 104 is generally set by relative size changes between the devices 112 and 114 and the devices 116 and 118. In one example, the signals C and Cn may be complementary. Compared with the circuit of FIG. 1, the circuit 100 requires 3 additional devices (e.g., 114, 116 and 118) in the input buffer 104. The size of the devices 114, 116 and 118 typically contributes a negligible cost to the integrated circuit. Additional devices and control signals may be implemented to provide additional flexibility.

Figure 4B:
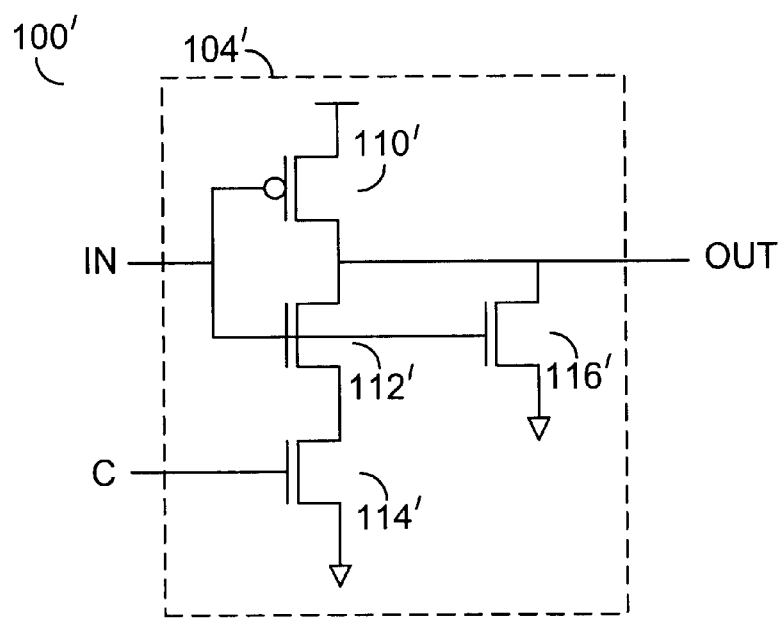

Referring to FIG. 4b, a circuit 104' is shown implementing a compact implementation of the circuit 104 using only four devices. The NMOS device 116' is always active and provides the threshold when operating in a first mode. When the NMOS device 114' is switched in response to the signal C, the threshold moves to the second level.

Figure 5:
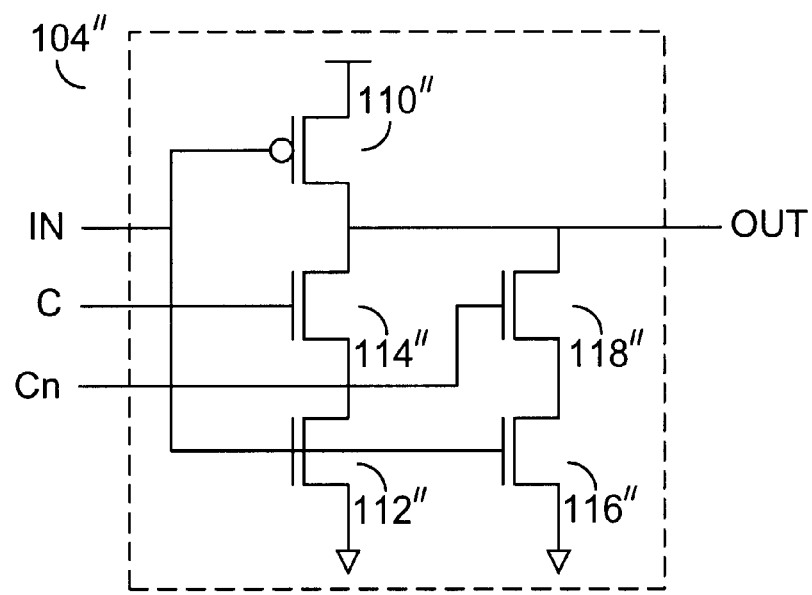
FIG. 5 is a schematic of an alternate embodiment of the present invention.

Referring to FIG. 5, an alternate implementation of the circuit 104" is shown. The second threshold level may be lower by switching the transistor 114" on. The switch/select devices 114" and 118" are alternatively positioned compared to the circuit 104 of FIG. 3 (e.g., shown on the other side). The operation of the circuit 104 and 104" is essentially the same.

Figure 6:
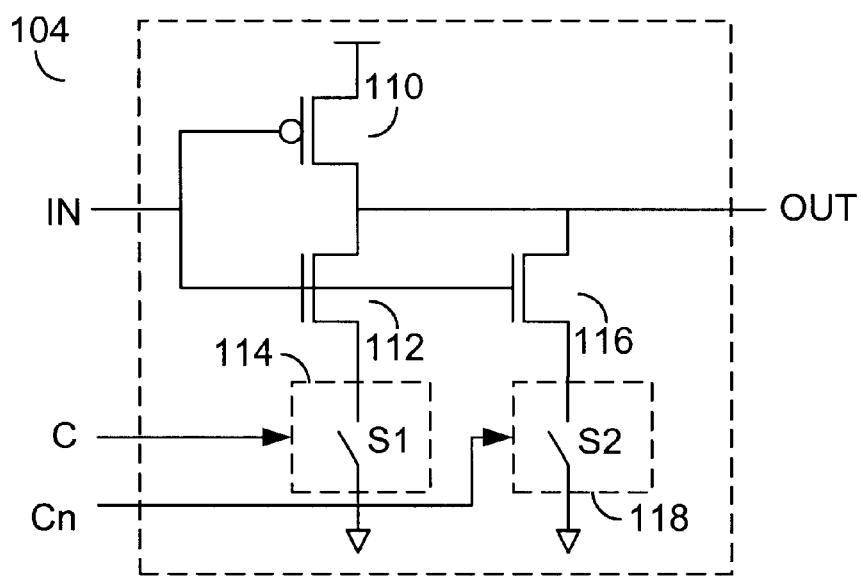
FIG. 6 is an alternate block diagram of the circuit of FIGS. 4(a–b)

Referring to FIG. 6, a generalized form of the circuit of FIG. 4 is shown. One or more switches S1 and S2 are shown implementing the select devices 114 and 118. The switches S1 and S2 could be implemented on either side of the input NMOS devices 112 and 116.

Figure 7:
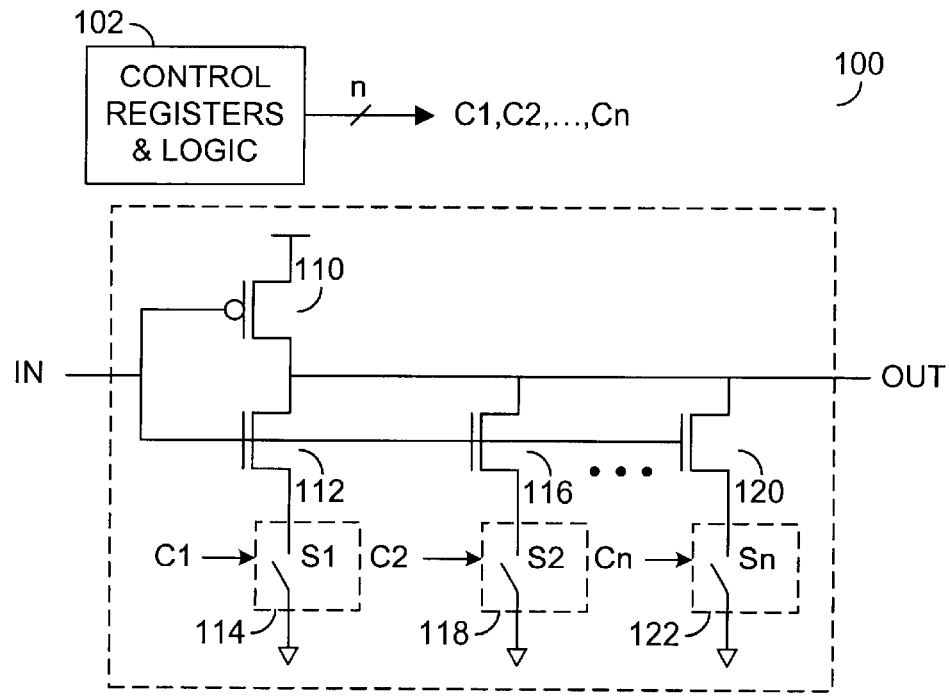
FIG. 7 is an alternate diagram of the circuit of FIGS. 4(a–b)

Referring to FIG. 7, the general case of n selectable input threshold states, where n is an integer, is shown. The register 102 presents a number of control signals C1–Cn. A number of select devices S1–Sn switch in response to the control signals C1–Cn.

Figure 8:
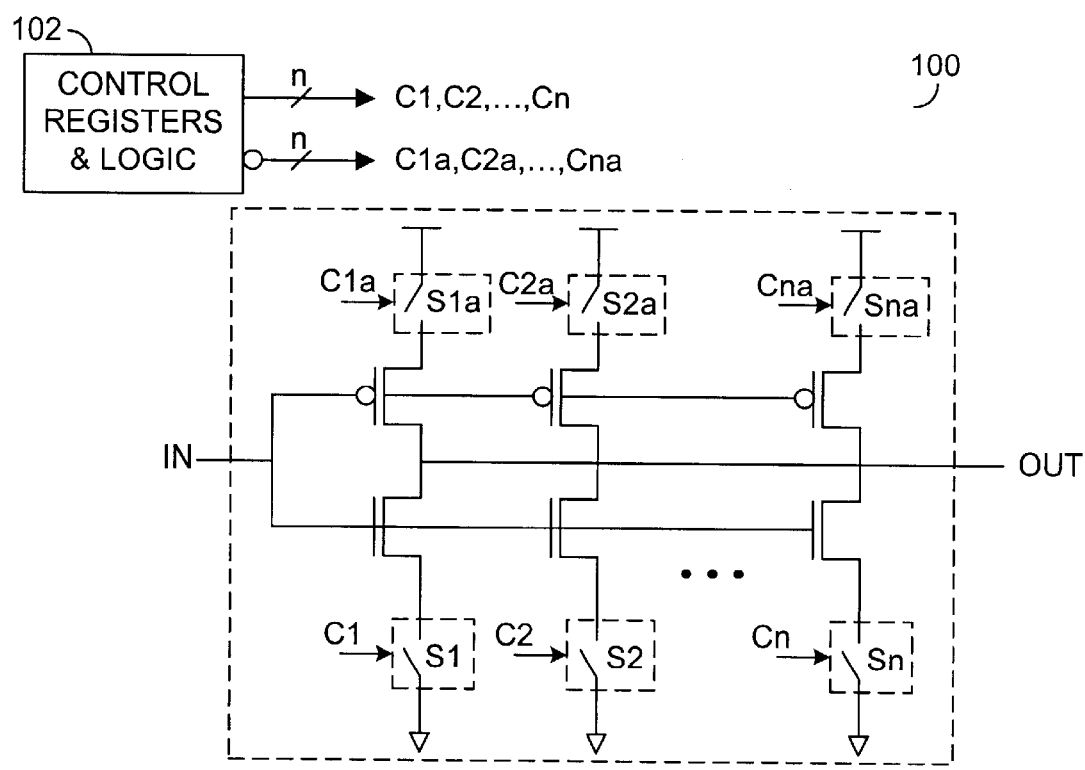
FIG. 8 is an alternate diagram of the circuit of FIGS. 4(a–b).

FIG. 8 shows an even more general implementation of the implementation of FIG. 7, showing that PMOS and/or NMOS devices used to produce the various threshold states may be independently varied. The switches S1–Sn and S1a–Sna may be on either side of the associated input PMOS/NMOS device.

While the circuit 100 has been illustrated and described with particular references to CMOS technology, other technologies and logic families (e.g., TTL, etc.) may be implemented accordingly to meet the design criteria of a particular implementation. The circuit 100 changes the ratio of a number of devices and, therefore, does not consume additional power when compared to conventional input buffers.

The circuit 100 may allow dynamically selectable threshold voltages on input pins with low cost and no additional power consumption. The circuit 100 may be particularly applicable for devices (such as joysticks, input devices etc.) that require more than one dynamically selectable threshold voltage. The circuit 100 may provide more than one input threshold voltage for each input pin on a device. The circuit 100 may provide a simple comparator function that typically requires a circuit that consumes DC power.

The various signals of the present invention are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) accordingly to meet the design criteria of a particular implementation.

While the invention has been particularly shown and described with reference to the preferred embodiments thereof, it will be understood by those skilled in the art that various changes in form and details may be made without departing from the spirit and scope of the invention.

What is claimed is:

1. A method for dynamically selecting an input threshold on an input pin, comprising the steps of:
    (A) receiving one or more control signals from a user selectable register;
    (B) coupling each of a first plurality of devices to (i) an input signal and (ii) an output node; and
    (C) coupling each of a second plurality of devices to one of said first plurality of devices, wherein said second plurality of devices control said input threshold in response to said one or more control signals.

2. The method according to claim 1, wherein said input pin is implemented on a microcontroller.

3. The method according to claim 1, further comprising: repeating steps (A)–(C) for selecting the input threshold of a plurality of input pins.

4. The method according to claim 3, wherein the threshold of said plurality of input pins are all the same threshold.

5. The method according to claim 3, wherein the threshold on a first one or more of said plurality of pins is different than the threshold of a second one or more of said plurality of pins.

6. The method according to claim 1, wherein step (A) further comprises:
    programming a voltage threshold of said one or more control signals.

7. The method according to claim 1, wherein said first plurality of devices each comprise a transistor and said second plurality of devices each comprise a transistor.

8. The method according to claim 1, wherein said method further comprises:
    selecting said threshold in response to a voltage threshold of particular technology.

9. An apparatus comprising:
    a register configured to store information used to generate one or more control signals;
    a first plurality of devices each (i) coupled to an output node and (ii) configured to provide an input threshold in response to an input signal; and
    a second plurality of devices each (i) coupled to one of said first plurality of devices and (ii) configured to control said input threshold on an input pin in response to said one or more control signals.

10. The apparatus according to claim 9, wherein:

said first plurality of devices each comprise a transistor and said second plurality of devices each comprise a transistor.

11. The apparatus according to claim 9, wherein each threshold of said first and second pluralities of devices is selected from a plurality of thresholds.

12. The apparatus according to claim 9, wherein each of said second plurality of devices is configured to control said input threshold in response to at least one of said one or more control signals.

13. The apparatus according to claim 9, wherein said one or more first devices are configured to generate an output voltage and said one or more second devices are configured to control a threshold of said output voltage.

14. The apparatus according to claim 9, wherein said second plurality of devices comprises:

one or more switches configured to control said input threshold.

15. The apparatus according to claim 9, wherein said first and second plurality of devices:

one or more first switches configured to control said input threshold; and one or more second switches configured to control said input threshold.

16. The apparatus according to claim 9, wherein said first plurality of devices comprise a first parallel device stack and said second plurality of devices comprise a second parallel device stack.

17. An apparatus comprising:

a register configured to store information used to generate one or more control signals;

a first plurality of devices each (i) coupled to a ground node and (ii) configured to provide an input threshold in response to an input signal; and a second plurality of devices each (i) coupled to one of said first plurality of devices and (ii) configured to control said input threshold on said input pin in response to said one or more control signals.

18. The method according to claim 1, wherein step (B)(ii) couples said first plurality of devices to a ground node.

19. The method according to claim 1, wherein:

each of said plurality of first devices comprises (i) a gate coupled to said input signal, (ii) a first source/drain coupled to said output node and (iii) a second source/drain; and each of said second plurality of devices comprises (i) a gate connected to one of said control signals, (ii) a first source/drain connected to said second source/drain of one of said plurality of first devices and (iii) a second source/drain connected to a ground node.

20. The method according to claim 9, wherein:

each of said plurality of first devices comprises (i) a gate coupled to said input signal, (ii) a first source/drain coupled to said output node and (iii) a second source/drain; and each of said second plurality of devices comprises (i) a gate connected to one of said control signals, (ii) a first source/drain connected to said second source/drain of one of said plurality of first devices and (iii) a second source/drain connected to a ground node.

* * * * *